United States Patent
Wang et al.

(10) Patent No.: US 6,232,184 B1
(45) Date of Patent: May 15, 2001

(54) METHOD OF MANUFACTURING FLOATING GATE OF STACKED-GATE NONVOLATILE MEMORY UNIT

(75) Inventors: Ling-Sung Wang, Hsinchu; Chingfu Lin, Taipei, both of (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/394,270

(22) Filed: Sep. 10, 1999

(30) Foreign Application Priority Data

Aug. 2, 1999 (TW) .................................................. 88113169

(51) Int. Cl.$^7$ ................................................. H01L 21/336
(52) U.S. Cl. ............................ 438/265; 438/257; 438/264
(58) Field of Search ...................................... 438/584, 585, 438/587, 588, 592, 593, 594, 595, 197, 257, 260, 264, 265

(56) References Cited

U.S. PATENT DOCUMENTS

| 4,397,077 | * | 8/1983 | Derbenwick et al. . |
| 4,945,068 | * | 7/1990 | Sugaya . |
| 6,057,197 | * | 5/2000 | Sung . |

* cited by examiner

*Primary Examiner*—Charles Bowers
*Assistant Examiner*—Evan Pert
(74) *Attorney, Agent, or Firm*—Jiawei Huang; J. C. Patents

(57) ABSTRACT

A method of manufacturing the floating gate of a stacked-gate type of nonvolatile memory unit. A gate oxide layer and a polysilicon layer are sequentially formed over a substrate. The polysilicon layer is etched to form a floating gate above the gate oxide layer. During the polysilicon etching operation, a polymeric material is also deposited on the sidewalls of the floating gate and over the exposed gate oxide. An isotropic chemical dry etching of the floating gate is carried out so that its bottom section is slightly wider than its top section. Finally, a thermal oxidation operation is carried out to form an oxide layer over the floating gate.

22 Claims, 2 Drawing Sheets

US 6,232,184 B1

METHOD OF MANUFACTURING FLOATING GATE OF STACKED-GATE NONVOLATILE MEMORY UNIT

BACKGROUND OF THE INVENTION

1. Field of the Invention

The present invention relates to a method of manufacturing a semiconductor device. More particularly, the present invention relates to a method of manufacturing the floating gate of a stacked-gate nonvolatile memory unit such that the floating gate has a better external profile and the memory unit has a higher performance.

2. Description of the Related Art

Stacked-gate nonvolatile memory can be classified roughly into erasable programmable read only memory (EPROM), electrically erasable programmable read only memory (EEPROM) and flash memory. All these memories use an isolated or floating gate as the place for storing electric charges. When the floating gate contains electric charges, a logic state of '1' is assumed. On the other hand, if no electric charges are present, the memory is assumed to be in a logic state of '0' by default. To tore electrons inside the floating gate, the electrons have to pass through a tunneling oxide layer. Therefore, the thickness of the tunneling oxide layer is one of the critical factors in determining how many electrons can pass through. If the tunneling oxide layer is too thick, very few electrons are able to pass through and there will not be enough electrons inside to indicate a logic state of '1'.

FIG. 1 is a schematic cross-sectional view showing the floating gate of a conventional stacked-gate type nonvolatile memory unit. A gate oxide layer 110 and a polysilicon floating gate 120 are formed over a substrate 100. After the floating gate 120 is patterned, a silicon oxide layer 130 is formed over the floating gate 120 by performing a thermal oxidation. An oxide/nitride/oxide (ONO) composite layer (not shown in the figure) is next formed over the silicon oxide layer 130 serving as interpolysilicon dielectrics (IPD).

However, during thermal oxidation, the lower edge portion 140 of the floating gate 120 is likely to be over-oxidized due to oxygen diffusion. Consequently, a thicker layer of oxide is formed having a shape very similar to a bird's beak formation when a field oxide layer is formed on a substrate by oxidation. In addition, the portion of the oxide layer 110 below the floating gate 120 is actually a channel (i.e. the tunneling oxide layer 115) through which hot electrons move in and out of the floating gate 120. As miniaturization of devices continues, the tunneling oxide layer 115 will contain a proportionally greater amount of thick oxide layer 140 so that hot electrons enter and leave the floating gate 120 with greater difficulty. Consequently, writing data into or erasing data from a nonvolatile memory unit becomes more unreliable.

SUMMARY OF THE INVENTION

Accordingly, one object of the present invention is to provide a method of manufacturing the floating gate of a stacked-gate nonvolatile memory unit such that the floating gate has a better external profile and the memory unit has a higher performance.

To achieve these and other advantages and in accordance with the purpose of the invention, as embodied and broadly described herein, the invention provides a method of manufacturing the floating gate of a stacked-gate type of nonvolatile memory unit. A gate oxide layer and a polysilicon layer are sequentially formed over a substrate. The polysilicon layer is etched to form a floating gate above the gate oxide layer. During the polysilicon etching operation, a polymeric material is also deposited on the sidewalls of the floating gate and over the exposed gate oxide. The floating gate is chemical dry etched to form a floating gate whose bottom section is slightly wider than the top section. Finally, a thermal oxidation operation is carried out to form an oxide layer over the floating gate.

According to the method of this invention, the polymer deposited during the first etching operation is able to protect the bottom portion of the floating gate. Therefore, when an isotropic chemical dry etching operation is subsequently carried out, the bottom portion of the floating gate will be wider. Because oxygen atoms can only penetrate up to a certain depth, there is no thickening of oxide near the edge of the gate oxide layer (or the tunneling oxide layer) at the bottom of the floating gate after thermal oxidation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
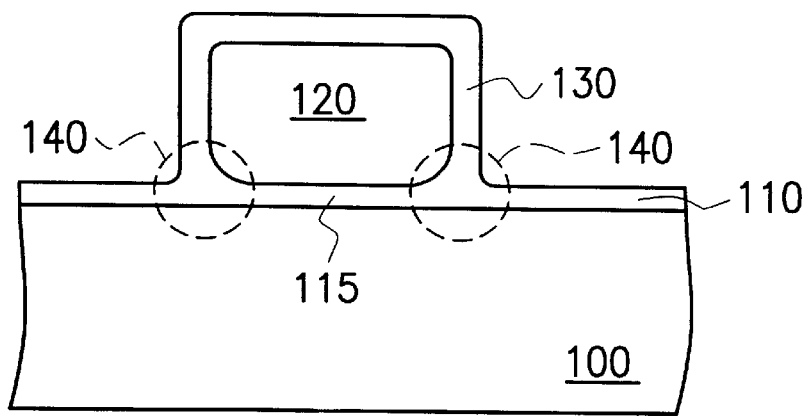
FIG. 1 is a schematic cross-sectional view showing the floating gate of a conventional stacked-gate type of nonvolatile memory unit.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic cross-sectional views showing the progression of manufacturing steps for producing the floating gate of a stacked-type nonvolatile memory unit according to one preferred embodiment of this invention.

Figure 2A:
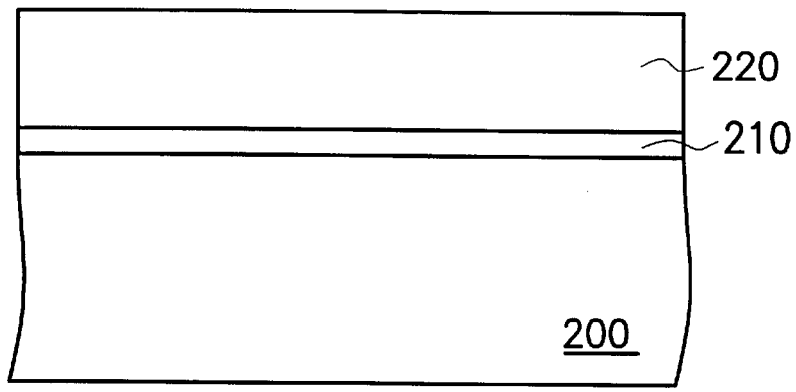
FIGS. 2A through 2D are schematic cross-sectional views showing the progression of manufacturing steps for producing the floating gate of a stacked-gate type nonvolatile memory unit according to one preferred embodiment of this invention.

As shown in FIG. 2A, a gate oxide layer 210 and a polysilicon layer 220 are sequentially formed over a substrate 200. The gate oxide layer can be formed by, for example, thermal oxidation at a temperature above 800° C. The polysilicon layer 220 can be formed by, for example, low-pressure chemical vapor deposition (LPCVD). The LPCVD operation is carried out at a temperature of between about 600 and 650° C. and pressure of between about 0.3 and 0.6 torr, and using silane ($SiH_4$) as a gaseous reactant.

Figure 2B:
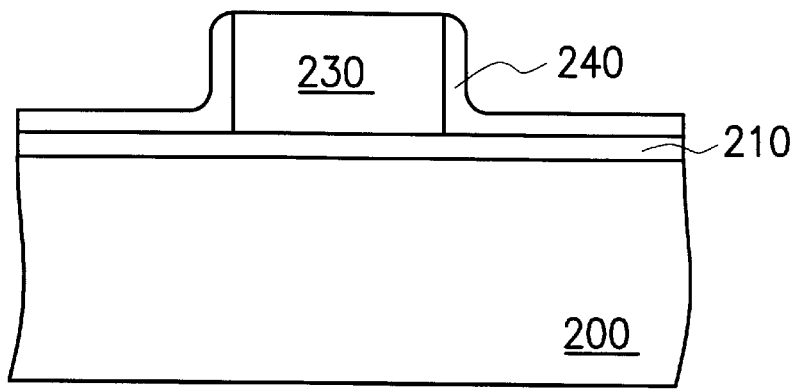

As shown in FIG. 2B, the polysilicon layer 220 is patterned to form a floating gate 230 above the gate oxide layer 210. The polysilicon layer 220 can be patterned, for example, using photolithographic and etching processes. During the etching process, some polymeric material is deposited on the exposed surface to form a polymer layer 240. In other words, a polymer layer 240 is also formed on the sidewalls of the floating gate 230 and over the exposed gate oxide layer 210. In addition, more polymeric material accumulates near the corners between the gate oxide layer 210 and the floating gate 230.

The polysilicon layer 220 can be etched by, for example, reactive ion etching (RIE). Gaseous etchants used in the etching step include, for example, HBr, $Cl_2$, $CF_4$ and $He/O_2$ having gas flow rates of about 80–200 sccm, 40–120 sccm, 1–40 sccm and 10–30 sccm, respectively. The ratio between helium and oxygen (the $He/O_2$ ratio) is preferably about 7:3. Other parametric settings of the etching operation include a reaction chamber pressure of about 2 to 12 mtorr, a RF power of between about 200 and 900 Watts and a bias voltage power of between about 20 and 100 Watts. Among the gaseous reactants, carbon tetrafluoride ($CF_4$) is a carbon source for polymer skeletons.

Figure 2C:
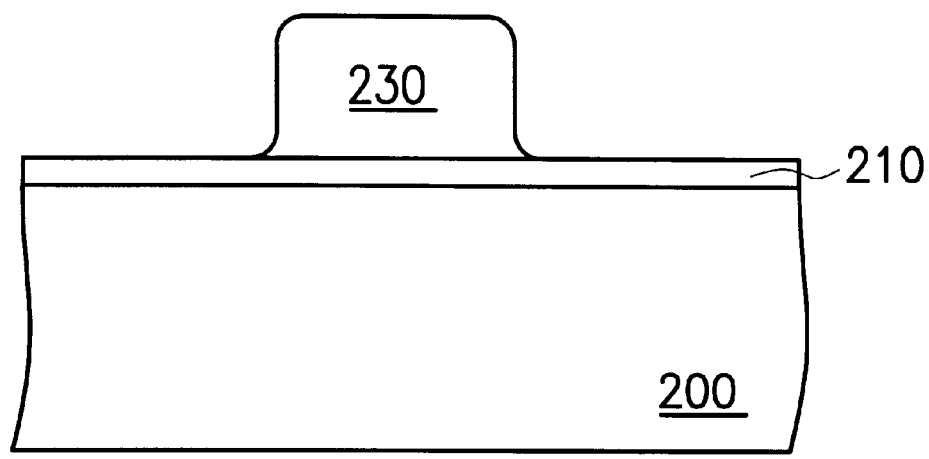

As shown in FIG. 2C, a chemical dry etching (CDE) operation is carried out not only to remove the polymer layer 240 but also to shape the external profile of the floating gate 230. Ultimately, the floating gate is slightly wider at the bottom than at the top. This is because the bottom portion of the floating gate 230 is covered by a thicker polymer layer 240 (as shown in FIG. 2B) and chemical dry etching is an isotropic etching process.

In general, a mixture of halogen-containing gas and oxygen-containing gas is the preferred gaseous etchant for carrying out chemical dry etching. The ratio of halogen-containing gas to oxygen-containing gas is roughly 1:1. For example, the halogen-containing gas can be carbon tetrafluoride ($CF_4$) and the oxygen-containing gas can be oxygen ($O_2$). The gaseous flow rate of $CF_4$ and $O_2$ can be about 20–500 sccm and about 20–500 sccm, respectively. Minor amounts of inert gas such as nitrogen ($N_2$) with a flow rate of about 1–100 sccm can be added to the gaseous mixture serving as a diluent.

Figure 2D:
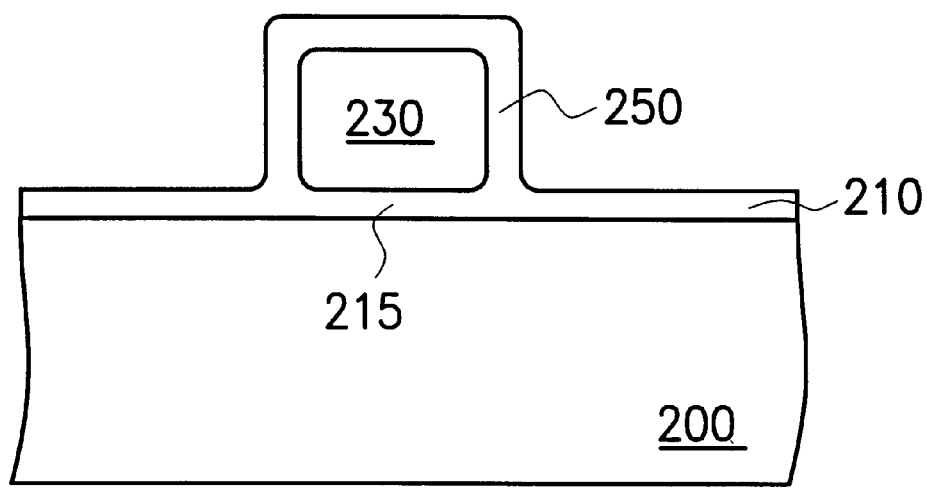

As shown in FIG. 2D, a thermal oxidation is carried out to form an oxide layer 250 over the floating gate 230. Because the bottom portion of the floating gate 230 is wider and there is a maximum range of diffusion for oxygen atoms in thermal oxidation, a uniformly thick gate oxide layer 210 (or tunneling oxide layer 215) is formed under the floating gate 230.

In summary, the invention utilizes the first etching process to deposit a thicker layer of protective polymer near the bottom of the floating gate. The floating gate is next shaped by performing chemical dry etching. Since chemical dry etching is an isotropic etching operation, the bottom section of the floating gate is wider than the top section. With a tapering floating gate profile, edge thickening of the tunneling oxide layer after a thermal oxidation can be prevented. With a uniformly thick tunneling oxide layer, hot electrons can easily enter or leave the floating gate 230. Since writing data into or erasing data from a nonvolatile memory unit depends very much on the height of the barrier preventing the movement of hot electrons, operating efficiency of the memory unit is improved.

It will be apparent to those skilled in the art that various modifications and variations can be made to the structure of the present invention without departing from the scope or spirit of the invention. In view of the foregoing, it is intended that the description of the present invention covers modifications and variations provided they fall within the scope of the following claims and their equivalents.

What is claimed is:

1. A method for manufacturing a gate electrode, comprising the steps of:
    providing a substrate;
    forming a gate oxide layer over the substrate;
    forming a polysilicon layer over the gate oxide layer;
    etching the polysilicon layer to form a gate electrode above the gate oxide layer and at the same time depositing polymeric material on sidewalls of the gate electrode and over the gate oxide layer;
    performing a chemical dry etching operation to remove the plylmeric material and to shape the gate electrode; and
    performing a thermal oxidation to form an oxide layer over the gate electrode.

2. The method of claim 1, wherein the step of etching the polysilicon layer includes reactive ion etching.

3. The method of claim 1, wherein the polysilicon layer is etched using gaseous etchants that include HBr, $Cl_2$, $CF_4$ and $He/O_2$.

4. The method of claim 3, wherein the polysilicon layer is etched at a pressure of between about 2 and 12 mtorr and gas flow rates for HBr, $Cl_2$, $CF_4$ and $He/O_2$ of about 80–200 sccm, 40–120 sccm, 1–40 sccm and 10–30 sccm, respectively.

5. The method of claim 3, wherein the ratio of helium to oxygen (the $He/O_2$ ratio) is about 7:3.

6. The method of claim 1, wherein the chemical dry etching operation is carried out using a gaseous etchant containing halogen-containing gas and oxygen-containing gas.

7. The method of claim 6, wherein the halogen-containing gas and the oxygen containing gas are in a 1:1 ratio.

8. The method of claim 6, wherein the gas flow rates of the halogen-containing gas and the oxygen-containing gas are both 20–500 sccm.

9. The method of claim 6, wherein the halogen-containing gas includes carbon tetrafluoride ($CF_4$).

10. The method of claim 6, wherein the oxygen-containing gas includes oxygen ($O_2$).

11. The method of claim 6, wherein the gaseous etchant further includes some inert gas as a diluent.

12. The method of claim 11, wherein the inert gas includes nitrogen ($N_2$).

13. The method of claim 12, wherein the inert gas has a flow rate of about 1–100 sccm.

14. A method for forming the floating gate of a stacked-gate type of nonvolatile memory unit, comprising the steps of:
    providing a substrate having a gate oxide layer thereon;
    forming a polysilicon layer over the gate oxide layer;
    patterning the polysilicon layer to form a floating gate whose bottom section widens abruptly near the gate oxide layer, and
    performing thermal oxidation to form an oxide layer over the floating gate.

15. The method of claim 14, wherein the step of patterning the polysilicon layer includes the substeps of:
    etching the polysilicon layer to form a floating gate and at the same time depositing some polymeric material on the sidewalls of the floating gate and the gate oxide layer; and
    performing chemical dry etching on the polymeric material and the floating gate.

16. The method of claim 15, wherein the polymeric material and the polysilicon layer are etched using gaseous etchants that include HBr, $Cl_2$, $CF_4$ and $He/O_2$.

17. The method of claim 15, wherein the chemical dry etching operation is carried out using a gaseous etchant containing halogen-containing gas and oxygen-containing gas.

18. The method of claim 17, wherein the halogen-containing gas and the oxygen-containing gas are in a 1:1 ratio.

19. The method of claim 17, wherein the halogen-containing gas includes carbon tetrafluoride ($CF_4$).

20. The method of claim 17, wherein the oxygen-containing gas includes oxygen ($O_2$).

21. The method of claim 17, wherein the gaseous etchant further includes some inert gas as a diluent.

22. The method of claim 21, wherein the inert gas includes nitrogen ($N_2$).

* * * * *